United States Patent
Yang

(10) Patent No.: US 8,264,880 B1
(45) Date of Patent: Sep. 11, 2012

(54) REPROGRAMMING NON-VOLATILE MEMORY DEVICES FOR READ DISTURBANCE MITIGATION

(75) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/249,080

(22) Filed: Sep. 29, 2011

Related U.S. Application Data

(62) Division of application No. 12/434,544, filed on May 1, 2009, now Pat. No. 8,031,521.

(60) Provisional application No. 61/054,723, filed on May 20, 2008.

(51) Int. Cl.
*G11C 11/34* (2006.01)

(52) U.S. Cl. ......... 365/185.04; 365/185.09; 365/185.11; 365/185.12; 365/185.21; 365/185.24; 365/185.29; 365/185.33

(58) Field of Classification Search ............. 365/185.04, 365/185.09, 185.11, 185.12, 185.21, 185.24, 365/185.29, 185.33
See application file for complete search history.

(56) References Cited

U.S. PATENT DOCUMENTS

| | | | |
|---|---|---|---|
| 4,718,041 A | 1/1988 | Baglee et al. | |
| 5,784,315 A | 7/1998 | Itoh | |
| 6,078,520 A | 6/2000 | Tobita et al. | |
| 6,119,245 A | 9/2000 | Hiratsuka | |
| 6,134,143 A | 10/2000 | Norman | |
| 6,278,633 B1 * | 8/2001 | Wong et al. | 365/185.21 |
| 6,480,416 B2 | 11/2002 | Katayama et al. | |
| 6,594,183 B1 | 7/2003 | Lofgren et al. | |
| 6,714,447 B2 | 3/2004 | Satoh et al. | |
| 6,714,453 B2 * | 3/2004 | Cavaleri et al. | 365/185.12 |
| 6,751,123 B2 | 6/2004 | Katayama et al. | |
| 6,765,840 B2 | 7/2004 | Sato et al. | |
| 6,807,103 B2 * | 10/2004 | Cavaleri et al. | 365/185.11 |
| 6,894,926 B2 | 5/2005 | Guterman et al. | |
| 7,113,432 B2 | 9/2006 | Mokhlesi | |
| 7,136,307 B2 * | 11/2006 | Piersimoni et al. | 365/185.29 |
| 7,137,027 B2 | 11/2006 | Shiota et al. | |
| 7,167,399 B2 * | 1/2007 | Wooldridge | 365/185.29 |
| 7,286,401 B2 * | 10/2007 | Ishimaru et al. | 365/185.11 |
| 7,453,728 B2 | 11/2008 | Noguchi et al. | |
| 7,495,955 B2 | 2/2009 | Ido | |
| 7,567,464 B2 | 7/2009 | Gendrier et al. | |
| 7,826,263 B2 | 11/2010 | Lee et al. | |
| 8,036,035 B2 * | 10/2011 | Moschiano et al. | 365/185.29 |

* cited by examiner

*Primary Examiner* — Trong Phan

(57) ABSTRACT

The present disclosure includes systems and techniques relating to non-volatile memory. A described device includes a non-volatile memory structure including a first data area, and a second data area that stores information. The information can include a first value corresponding to the first data area, the first value being set responsive to a last programming cycle on the first data area, and a second value indicating a total number of programming or erasing operations on the first data area.

19 Claims, 8 Drawing Sheets

REPROGRAMMING NON-VOLATILE MEMORY DEVICES FOR READ DISTURBANCE MITIGATION

CROSS REFERENCE TO RELATED APPLICATIONS

This application is a divisional application of and claims the benefit of U.S. patent application Ser. No. 12/434,544, filed May 1, 2009 and entitled "Reprogramming Non-Volatile Memory Devices For Read Disturbance Mitigation" (now U.S. Pat. No. 8,031,521), which claims the benefit of the priority of U.S. Provisional Application Ser. No. 61/054,723, filed May 20, 2008 and entitled "Flash Memory Devices with Reprogramming for Read Disturbance Mitigation." The entire contents of the above-identified applications are hereby incorporated by reference.

BACKGROUND

The present disclosure describes systems and techniques relating to non-volatile memory.

Devices and systems can store or retrieve data using non-volatile memory such as flash memory. For example, a digital camera can store an image to a non-volatile memory structure. In another example, a digital media player such as an MP3 player can read a digital audio file from a non-volatile memory structure and play the contents of the audio file. Mobile devices such as a mobile phone or a personal digital assistant (PDA) can read data from and write data to one or more non-volatile memory structures.

Devices and systems can perform multiple operations on non-volatile memory such as reading and programming operations. In some implementations, types of programming operations can include writing and/or erasing data. Erasing data in such memory can include marking a data area as invalid or not programmed, or can include writing data to a data area to effect an erasure. Non-volatile memory such as flash memory can be divided into multiple data areas. Each data area can be individually addressed and accessed. Accordingly, an operation can include obtaining an address for one or more data areas or a portion of a data area. Also, a data area can be divided into individual bits or larger aggregate data units such as bytes. In some implementations, a data area can be arranged as a data page or a data block.

SUMMARY

The present disclosure includes systems and techniques that enable selective reprogramming for non-volatile memory structure(s).

Systems and techniques for selective reprogramming can include accessing a threshold value that is associated with a data area of a non-volatile memory structure; performing a comparison using the threshold value and a first value associated with the data area; and selectively reprogramming data of the data area based on the comparison.

These, and other aspects, can include one or more of the following features. Accessing the threshold value can include accessing a second value that reflects a count of programming and/or erasing operations on the data area; and using the second value to select the threshold value. Using the second value to select the threshold value can include accessing a data structure using the second value to retrieve the threshold value. The data structure can store a plurality of threshold values. In some implementations, a threshold value can specify a number of read cycles for the data area. The first value can reflect a count of read operations on the data area. In some implementations, a threshold value can specify a maximum elapsed time for the data area. The first value can be indicative of an elapsed time since a last programming operation occurred on the data area. Accessing the threshold value can include accessing a static value to initialize the threshold value. Implementations can include performing a second comparison based on a second threshold value and a timestamp value indicative of when a last programming operation occurred on the data area, where the second threshold value specifies a maximum elapsed time; and selectively reprogramming data of the data area based on a result of second comparison. Performing a second comparison can include calculating an elapsed time since the last programming based on a current timestamp and the timestamp value indicative of when the last programming operation occurred on the data area.

Reprogramming can include reprogramming the data of the data area when the comparison indicates that the first value meets or exceeds the threshold value. Implementations can include resetting the first value in response to an erase and/or write operation corresponding to the data area. Reprogramming can include copying the data of the data area to a different data area of the non-volatile memory structure; and resetting a value of the different data area. Reprogramming can include reading data of the data area; writing the data to the data area; and resetting the first value. Reprogramming can include reading data of the data area, storing the read data, erasing the data area, writing the read data to the data area. Implementations can include incrementing a second value that reflects a count of writing and/or erasing operations on the data area. Implementations can include selectively reprogramming data of an adjacent data area based on the comparison.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a mobile telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, a system can include a non-volatile memory structure that includes a data area and a processing device communicatively coupled with the non-volatile memory structure. The processing device can be configured to perform operations including accessing a threshold value that is associated with the data area; performing a comparison using the threshold value and a first value associated with the data area; and selectively reprogramming data of the data area based on the comparison.

These, and other aspects, can include one or more of the following features. Accessing the threshold value can include accessing a second value that reflects a count of programming and/or erasing operations on the data area; and using the second value to select the threshold value. Using the second value to select the threshold value can include accessing a data structure using the second value to retrieve the threshold value. The data structure can store a plurality of threshold values. In some implementations, a threshold value can specify a number of read cycles for the data area. The first value can reflect a count of read operations on the data area. In some implementations, a threshold value can specify a maximum elapsed time for the data area. The first value can be indicative of an elapsed time since a last programming operation occurred on the data area. Accessing the threshold value can include accessing a static value to initialize the threshold value.

Reprogramming can include reprogramming the data of the data area when the comparison indicates that the first value meets or exceeds the threshold value. Implementations can include resetting the first value in response to an erase and/or write operation corresponding to the data area. Reprogramming can include copying the data of the data area to a different data area of the non-volatile memory structure; and resetting a value of the different data area. Reprogramming can include reading data of the data area; writing the data to the data area; and resetting the first value. Reprogramming can include reading data of the data area, storing the read data, erasing the data area, writing the read data to the data area. Implementations can include incrementing a second value that reflects a count of writing and/or erasing operations on the data area. Implementations can include selectively reprogramming data of an adjacent data area based on the comparison.

In another aspect, systems and devices can include a non-volatile memory structure comprising a first data area; and a second data area that stores values comprising a first value corresponding to the first data area, the first value being set responsive to a last programming cycle on the first data area.

These, and other aspects, can include one or more of the following features. The stored values can include a second value indicating a total number of programming and/or erasing operations on the first data area. The non-volatile memory structure can include the second data area. The stored values can include a threshold data structure including a plurality of threshold values, each threshold value mapping a total number of programming operations on a data area to an allowable number of read operations. The first value can be indicative of a timestamp corresponding to the last programming cycle on the first data area. The first value can store a counter value, with the counter value being set to zero in response to the last programming cycle on the first data area, and with the counter value being incremented on each read of the first data area.

The subject matter described in this specification can be implemented to realize one or more of the following potential advantages. One or more of the described systems and techniques can be used to selectively reprogram data stored in one or more data areas of a non-volatile memory structure to maintain integrity of the stored data. One or more of the described systems and techniques can be used to progressively adjust how often reprogramming occurs based on a data area's increased susceptibility to read disturbances. Data for selective reprogramming can be stored within a removable memory device containing the non-volatile memory structure to allow a continuity of reprogramming operations between different systems/devices using the removable memory device.

Details of one or more implementations are set forth in the accompanying drawings and the description below. Other features, objects, and advantages may be apparent from the description and drawings, and from the claims.

DRAWING DESCRIPTIONS

Like reference symbols in the various drawings indicate like elements.

DETAILED DESCRIPTION

Non-volatile memory devices such as flash memory devices or phase change memory devices may suffer read disturbance(s) in addition to program or write disturbances. Under a read disturbance, data stored in a non-volatile memory device may become increasingly unreliable after multiple read operations on the data cells/areas of interest or their neighboring cells/areas. A read disturbance may be more severe for non-volatile memory cells/areas that have experienced many erase/program cycles. To mitigate the impact of read disturbance, data in a non-volatile memory device can be refreshed, e.g., reprogrammed, to prevent data loss. In general, a memory device that suffers from read disturbance and/or has data retention issues may benefit from using one or more of the selective reprogramming techniques presented herein.

Figure 1:
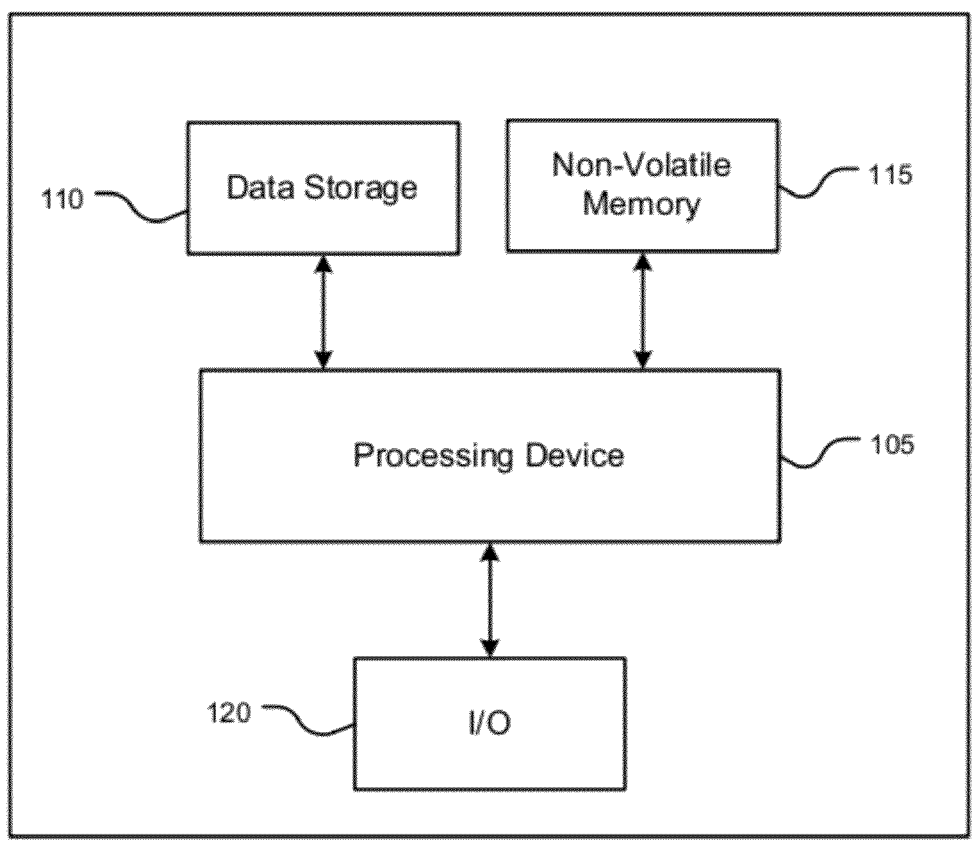
FIG. 1 shows an example of a system with non-volatile memory.

FIG. 1 shows an example of a system with non-volatile memory that can perform one or more techniques described herein. A system can include a data processing device with embedded or removable non-volatile memory. A data processing device such as a digital media player, digital camera, PDA, mobile phone, computer, or embedded device can include one or more of data storage 110, nonvolatile memory structure 115 such as a flash memory structure, processing device 105, and input/output (I/O) 120 channels such as video/audio/image input, text input, positioning input, or video/audio/image output. In some implementations, data storage 110 can be combined with non-volatile memory 115. In some implementations, processing device 105 can include one or more processors or specialized processing logic. Processing device 105 can read from and/or write to the non-volatile memory structure 115. For example, data received from I/O 120 can be stored on the non-volatile memory structure 115. In another example, content from a file retrieved from non-volatile memory structure 115 can be digitally reproduced as output on I/O 120. Processing device 105 can selectively reprogram data stored in the non-volatile memory structure 115. In some implementations, a removable unit can contain the non-volatile memory structure 115.

Figure 2A:
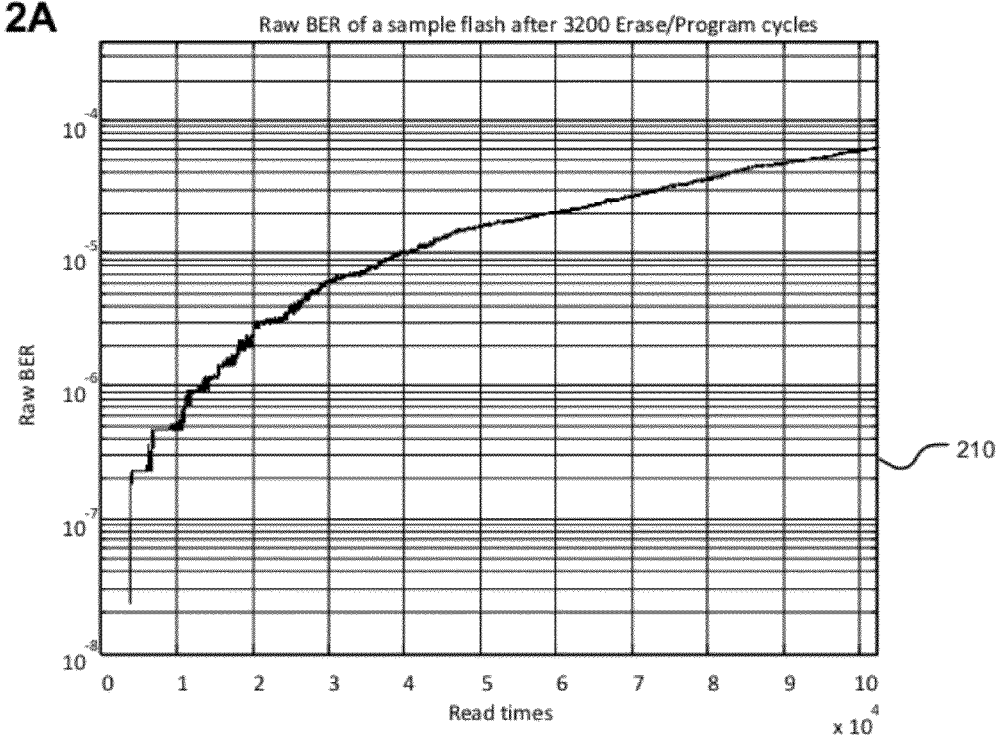
FIGS. 2A, 2B show examples of measured bit-error-rates (BERs) of a flash memory block as a function of a number of repetitive read operations for different numbers of accumulated erase/program cycles.
Figure 2B:
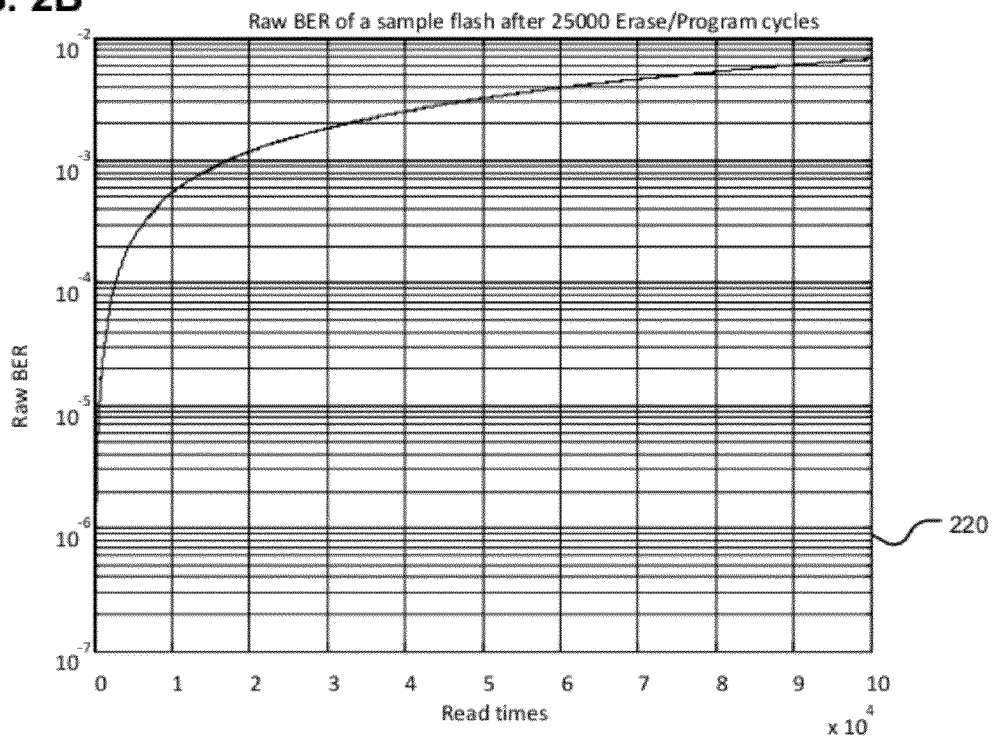

FIGS. 2A, 2B show examples of measured bit-error-rates (BERs) of a flash memory block as a function of a number of repetitive read operations for respective different numbers of accumulated erase/program cycles. The title of the chart 210 in FIG. 2A is "Raw BER of a sample flash after 3200 Erase/Program cycles," whereas the title of the chart 220 in FIG. 2B is "Raw BER of a sample flash after 25000 Erase/Program cycles. For these charts 210, 220, the label of the y-axis is "Raw BER," and the label of the x-axis is "Read Times." In FIG. 2A, the memory block has experienced approximately 3,200 erase and program cycles prior to the commencement of the measurement's repetitive read operations. FIG. 2A shows in chart 210 that the BER for the memory block increases after each read operation. In FIG. 2B, the memory block has experienced approximately 25,000 erase and program cycles prior to the commencement of the measurement's repetitive read operations. FIG. 2B shows in chart 220 that the BER for the memory block once again increases after each read operation. However, with the increased number of erase and program cycles, the error rate is markedly worse when comparing BERs for each unique number of accumulated read operations (compare charts 220, 210). The BER measurements in charts 210, 220 do not include using error correction codes. However, in some implementations, error correction codes can be used.

Selective reprogramming techniques can include one or more different techniques. These techniques can be used separately or concurrently. One technique includes tracking the number of read operations for each data area of a non-volatile memory structure. In such an example, once the number of read operations for a data area reaches a threshold value, a processing device can perform a reprogramming operation, e.g., read data from the data area and program the non-volatile memory with the same data. Another technique can include examining the time when a data block was last programmed. If, for example, the time elapsed since the last programming exceeds a threshold value, the processing device can perform a reprogramming operation.

Reprogramming operation types can include local reprogramming and non-local reprogramming. For local reprogramming, the processing device can read back data stored in a block, can erase the block, and can reprogram the block with the same data. For non-local reprogramming, the processing device can copy data from one block in the non-volatile memory to a different block and mark the original block as invalid.

Figure 3A:
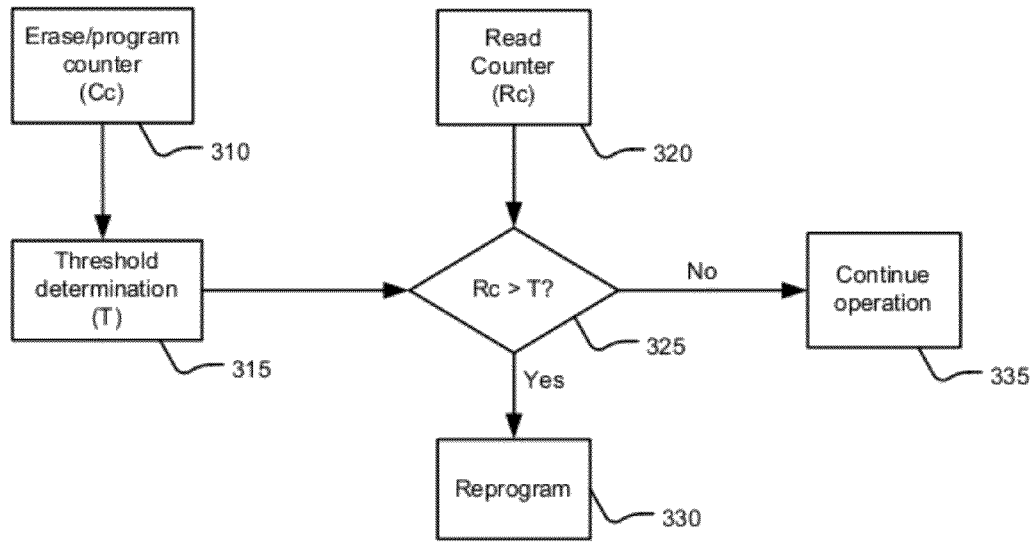
FIGS. 3A, 3B show different example techniques for selective reprogramming.
Figure 3B:
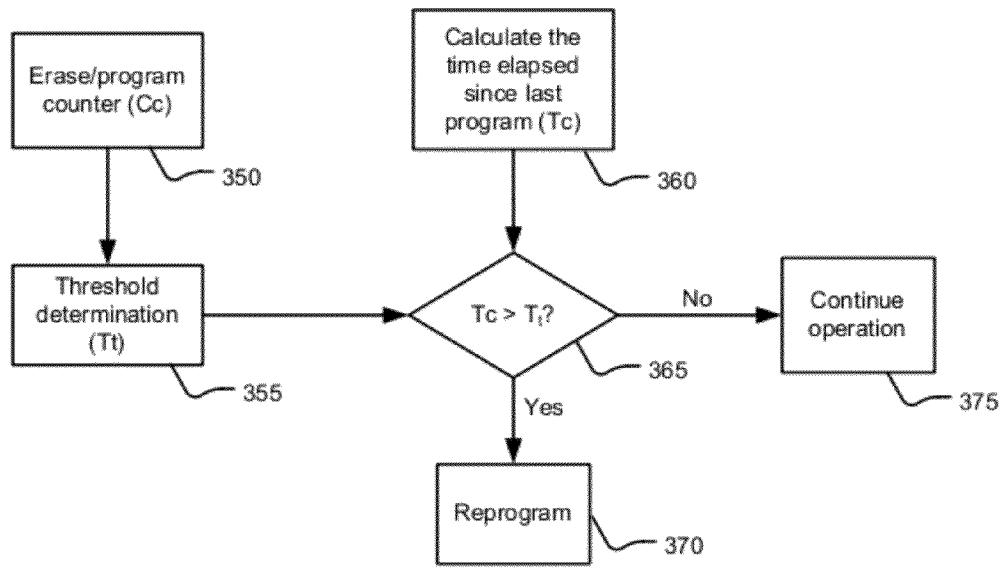

FIGS. 3A, 3B show different example techniques for selective reprogramming. In some implementations, these techniques can be used together. A read operation on a specified data area can trigger a selective reprogramming technique. Also, a process can trigger a selective reprogramming technique based on a timer or an insertion of a non-volatile memory device.

FIG. 3A shows an example of a selective reprogramming technique. A processing device can access an erase/program counter to retrieve the number of the erase/program cycles ($C_c$) for a specified data area 310. The processing device can determine the threshold value (T) based on $C_c$ 315. In this example, T specifies a maximum number of read operations. In some implementations, a threshold look-up table or a mapping function can produce a threshold value given a specified number of erase/program cycles. In some implementations, the processing device can use a static value for T, e.g., a value that does not depend on a number of erase/program cycles. The processing device can access a read counter to retrieve the number of the read operations ($R_c$) since the last programming operation on the specified data area 320. The processing device can perform a comparison 325 between $R_c$ and T. If $R_c$ exceeds T, a reprogramming operation can be invoked 330. Otherwise, the processing device can continue 335. In response to a programming of a data area, an associated E/P counter can be incremented and an associated read counter can be set to zero.

FIG. 3B shows a different example of a selective reprogramming technique. A processing device can access an erase/program counter to retrieve the number of the erase/program cycles ($C_c$) for a specified data area 350. The processing device can determine the threshold value ($T_t$) based on $C_c$ 355. In this example, $T_t$ specifies a maximum elapsed time. In some implementations, the processing device can use a static value for $T_t$, e.g., a value that does not depend on a number of erase/program cycles. The processing device can access a memory structure to retrieve the timestamp of the last programming of the data area and compute the time elapsed since the last programming ($T_c$) 360. The processing device can perform a comparison 365 between $T_c$ and $T_t$. If $T_c$ exceeds $T_t$, a reprogramming operation can be invoked 370 and can store the timestamp associated with this reprogramming operation for use in a future $T_c$ calculation 360. Otherwise, the processing device can continue 375. In some implementations, the processing device can periodically examine multiple data pages to perform respective time based-comparisons. In some implementations, the processing device can perform a time based-comparison when the device generates or receives a read request for a specified data area.

Erase operations for flash memory can be block based. Accordingly, the erase/program (E/P) counter can also be block based. However, read operations for flash memory can be page based. Therefore, a read counter can be page based. For time based-techniques, timestamps can also be page based. Current counter values such as $C_c$ and $R_c$ can be stored in a flash memory structure or in a separate memory structure. Timestamp values for $T_c$ computations can be similarly stored.

Figure 4A:
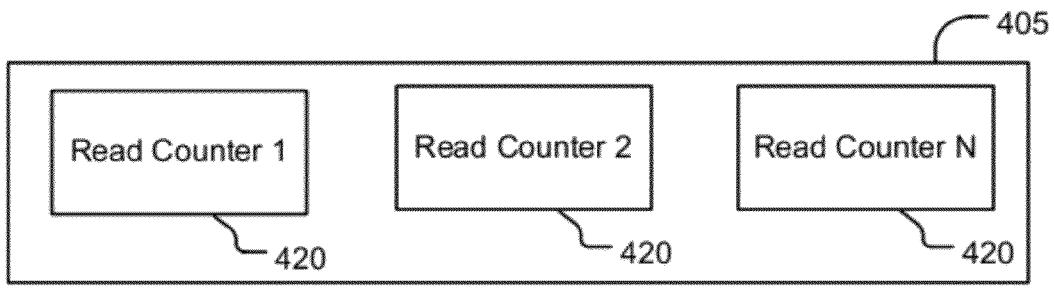
FIGS. 4A, 4B, 4C show different memory structure examples for selective reprogramming.
Figure 4B:
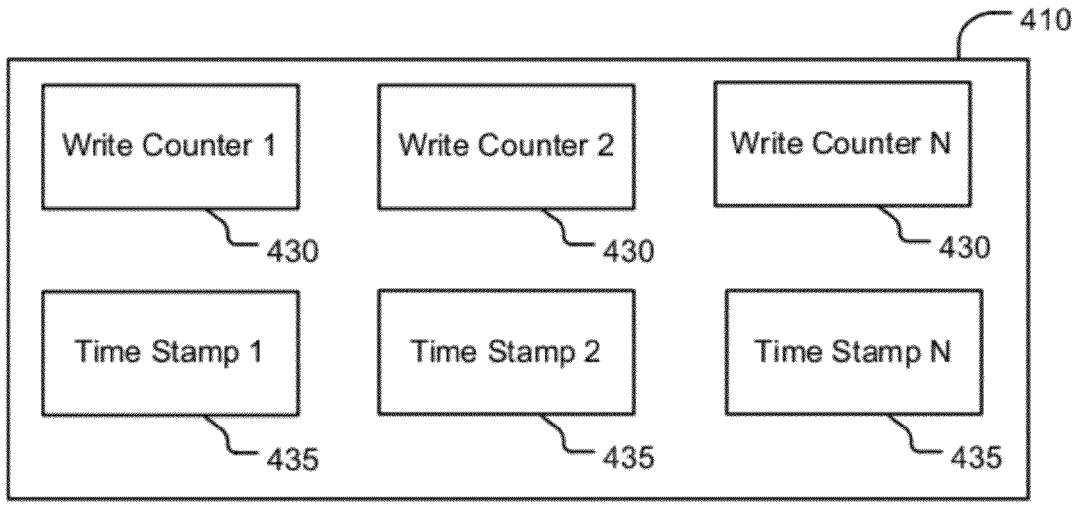
Figure 4C:
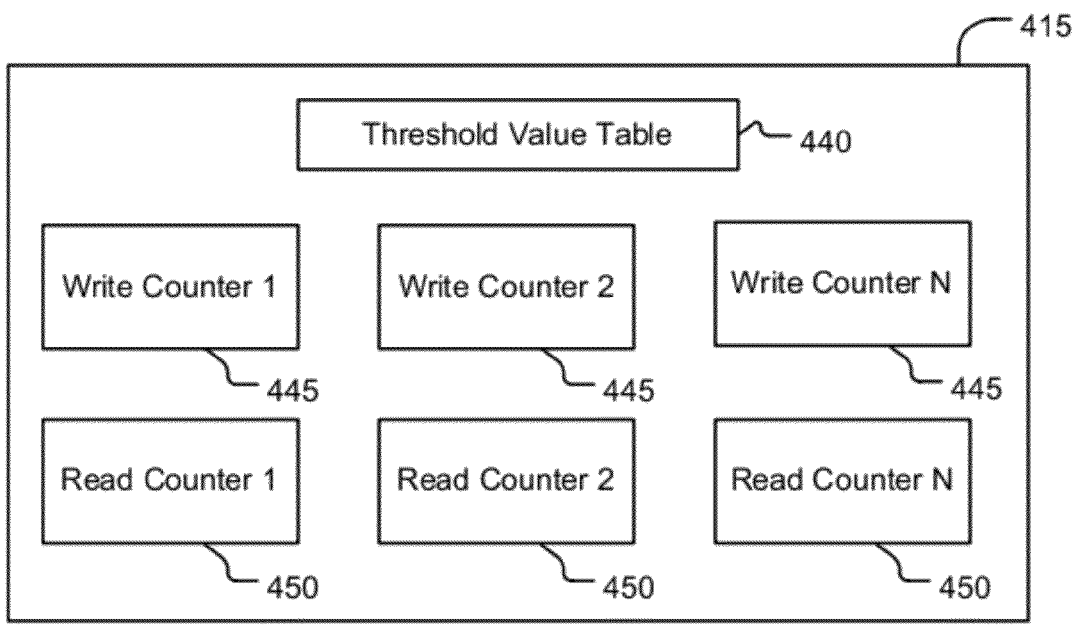

FIGS. 4A, 4B, 4C show different memory structure examples for selective reprogramming. Each memory structure 405, 410, 415 is associated with a non-volatile memory that includes one or more data areas. Memory such as non-volatile memory, Static Random Access Memory (SRAM), Random Access Memory (RAM) can store one or more memory structures 405, 410, 415 for selective reprogramming. In some implementations, a non-volatile memory associated with a memory structure 405, 410, 415 can the memory structure 405, 410, 415. However, in some implementations, a different memory such as a different non-volatile memory can store the memory structure 405, 410, 415.

In the example of FIG. 4A, memory structure 405 includes multiple read counters 420 for respective data areas in a non-volatile memory. Memory structure 405 can be used in implementations that use a single or static threshold value.

In the example of FIG. 4B, memory structure 410 includes multiple write counters 430 for respective data areas in a non-volatile memory. Memory structure 410 includes timestamps 435 for the respective data areas. Each timestamp 435 can record the time of the last programming of an associated data area. Time-based selective reprogramming techniques can use memory structures similar to that of memory structure 410.

In the example of FIG. 4C, memory structure 415 includes multiple read counters 450 for respective data areas in a non-volatile memory. Memory structure 415 includes write counters 445 for the respective data areas. Each write counter can track a number of write operations, e.g., E/P cycles, of an associated data area. Read counter based selective reprogramming techniques can use memory structures similar to that of memory structure 415. In some implementations, memory structure 415 can include a threshold value table 440. Threshold value table 440 can be used to produce a threshold value given a specified value from a write counter 445. The threshold value can be used in a comparison with a value of a read counter 450.

Figure 5:
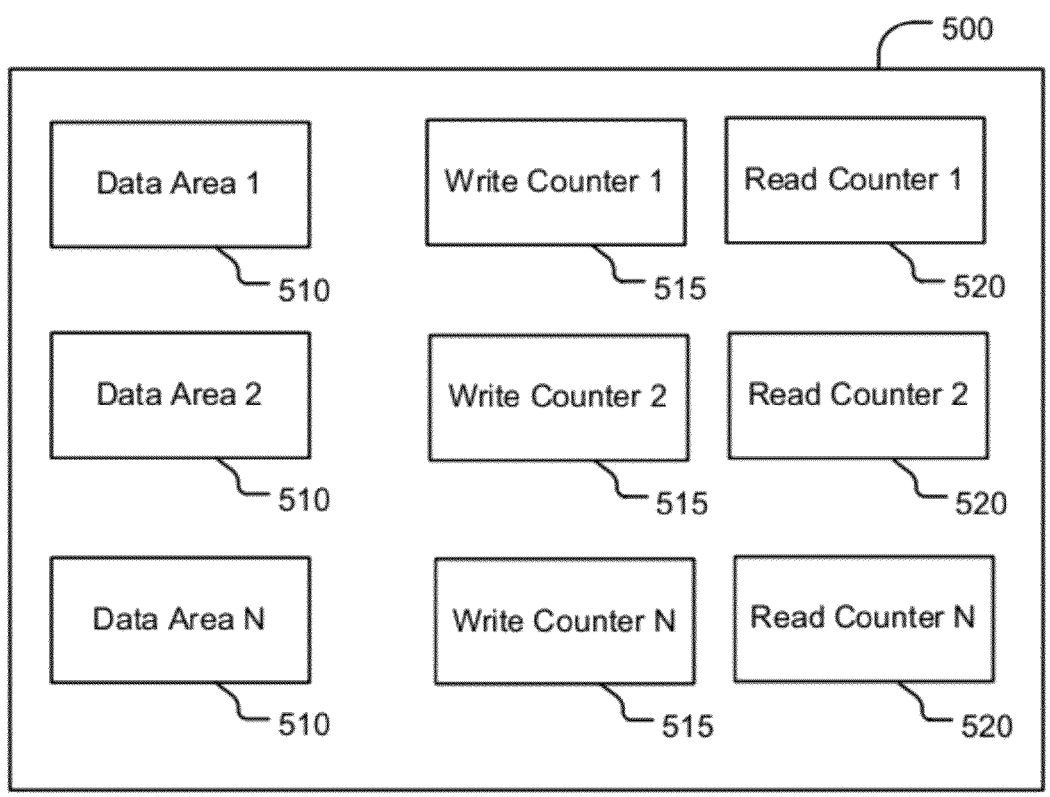
FIG. 5 shows an example of a non-volatile memory structure that stores data and counter values.

FIG. 5 shows an example of a non-volatile memory structure that stores data and counter values. Non-volatile memory structure 500 includes multiple data areas 510, multiple write counters 515, and multiple read counters 520. Each data area 510 has an associated write counter 515 and read counter 520. The write counters 515 and read counters 520 can be adjacent to their respective data areas 510 or can be in a dedicated region of non-volatile memory structure 500. In some implementations, the non-volatile memory structure 500 can be enclosed in a removable package for insertion and/or removal in devices such as a mobile phone or digital media player.

Figure 6:
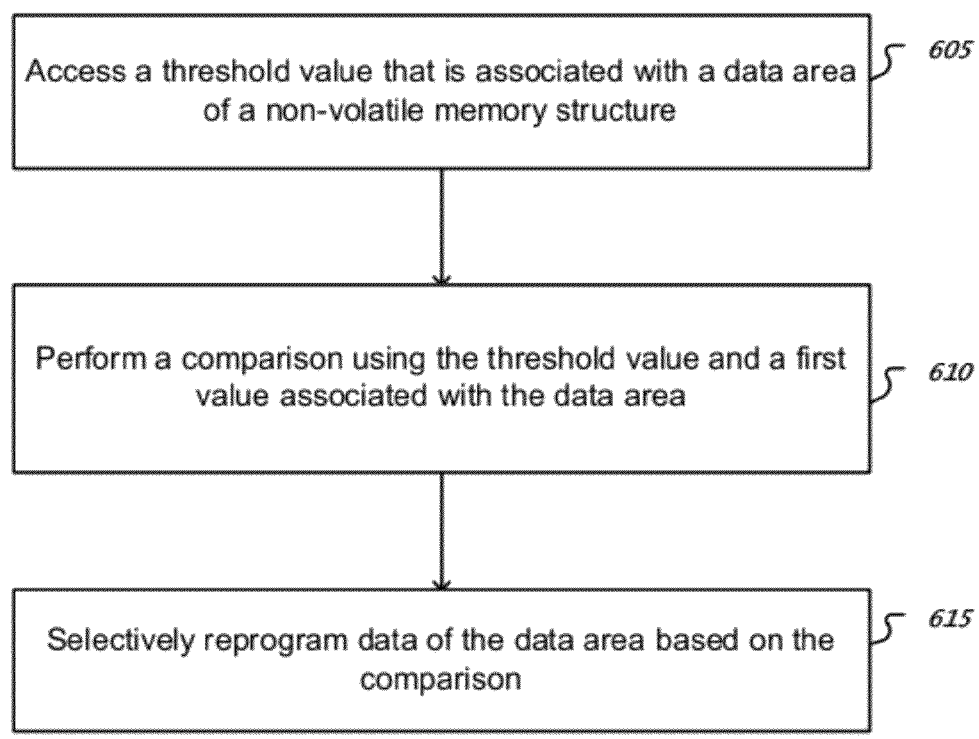
FIG. 6 shows a different example technique for selective reprogramming.

FIG. 6 shows a different example technique for selective reprogramming. A processing device such as data processing device can access 605 a threshold value that is associated with a data area of a non-volatile memory structure. In some implementations, a look-up table or mapping function can be used to select a threshold value based on an input including a count of programming operations on the data area. In some implementations, a static value can be used to initialize the threshold value.

The processing device can perform 610 a comparison using the threshold value and a first value associated with the data area. In some implementations, the first value can include a read counter that counts the number of read operations on the data area. In some implementations, the first value can include a timestamp value that records the time of the last programming operation on the data area.

The processing device can selectively reprogram 615 data of the data area based on the comparison in 610. For example, the processing device can reprogram the data of the data area if the comparison indicates that the first value exceeds the threshold value. In some implementations, where the first value includes a read counter, the processing device can reprogram the data when the read counter exceeds the threshold value. In some implementations, where the first value includes a timestamp, the processing device can reprogram the data if the comparison indicates an elapsed time greater than a time-based threshold value.

In some implementations, the processing device can perform multiple comparisons using a read counter and a timestamp value and respective different threshold values. The multiple comparisons can be performed separately to make separate reprogramming determinations or the output of the multiple comparisons can be combined to make a combined reprogramming determination.

The processing device can reset the first value if the device reprograms the data into the data area associated with the first value. In some implementations, the processing device can set an associated read counter to zero. In some implementations, the processing device can set an associated timestamp value to a current timestamp.

Read disturbances generated by a read operation on a data area may impact adjacent data areas. Accordingly, a reprogramming operation on one data area can trigger reprogramming operations on one or more adjacent data areas.

Figure 7:
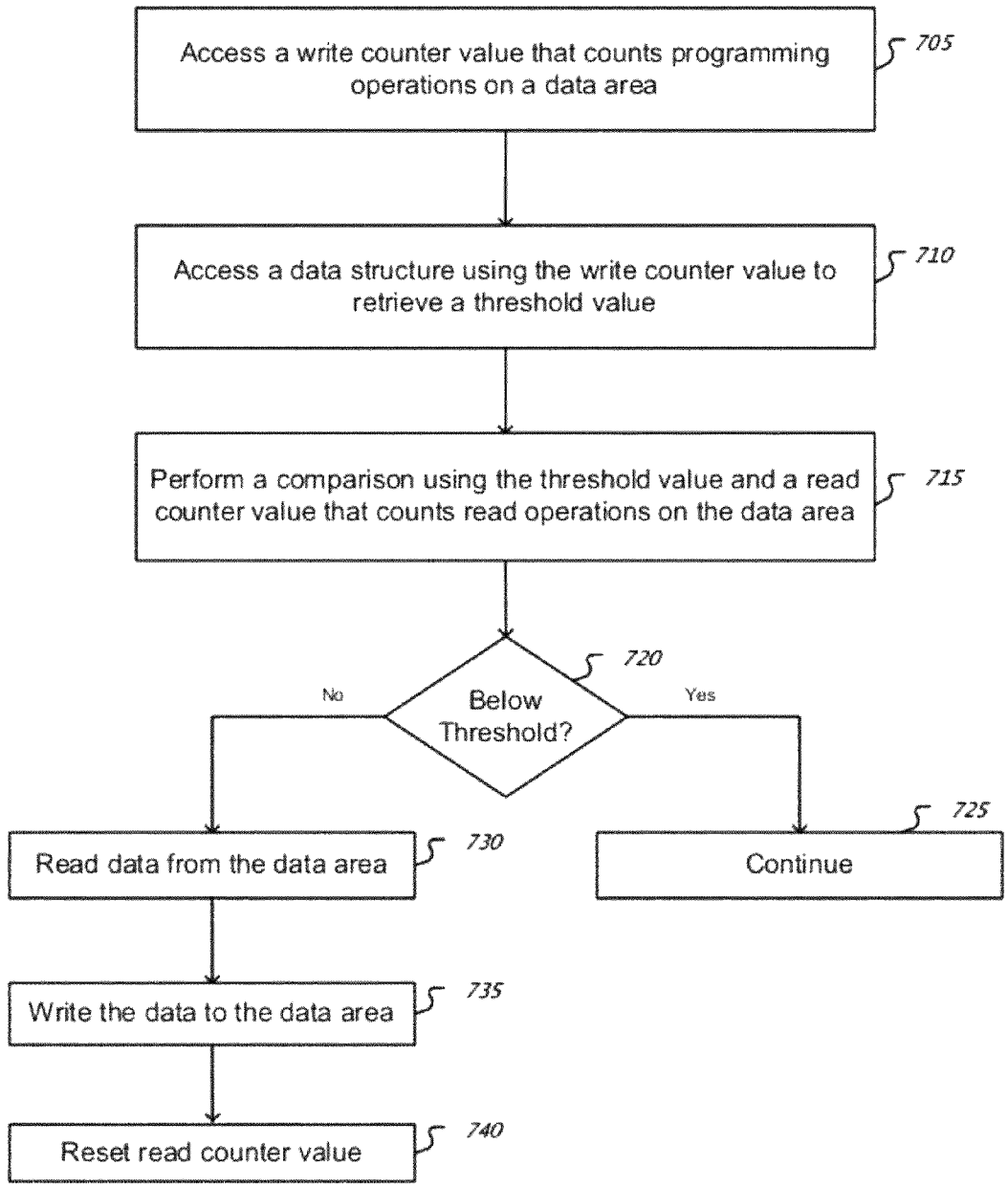
FIG. 7 shows an example of a read counter based technique for selective reprogramming.

FIG. 7 shows an example of a read counter based technique for selective reprogramming. A processing device can access 705 a write counter value that counts programming operations on a data area. The device can access 710 a data structure, such as a threshold data structure, using the write counter value to retrieve a threshold value. The threshold data structure can include multiple threshold values that correspond to multiple respective ranges for write counter values. The device can perform 715 a comparison using the threshold value and a read counter value that counts read operations on the data area.

If the read counter is below the threshold value 720, the device can continue 725 other operations. In some implementations, a read operation can trigger the technique of FIG. 7. Therefore, continuing other operations can include continuing on to read data from the data area and incrementing the associated read counter.

If the threshold value is equal to or above the threshold value 720, the device can perform a reprogramming operation. In an example of a reprogramming operation, the device can read 730 data from the data area, write 735 the data to the same data area, and reset 740 the read counter value associated with the written data area. In a different example, the device can write 735 the data to a data area different from the data area that was read 730.

Figure 8:
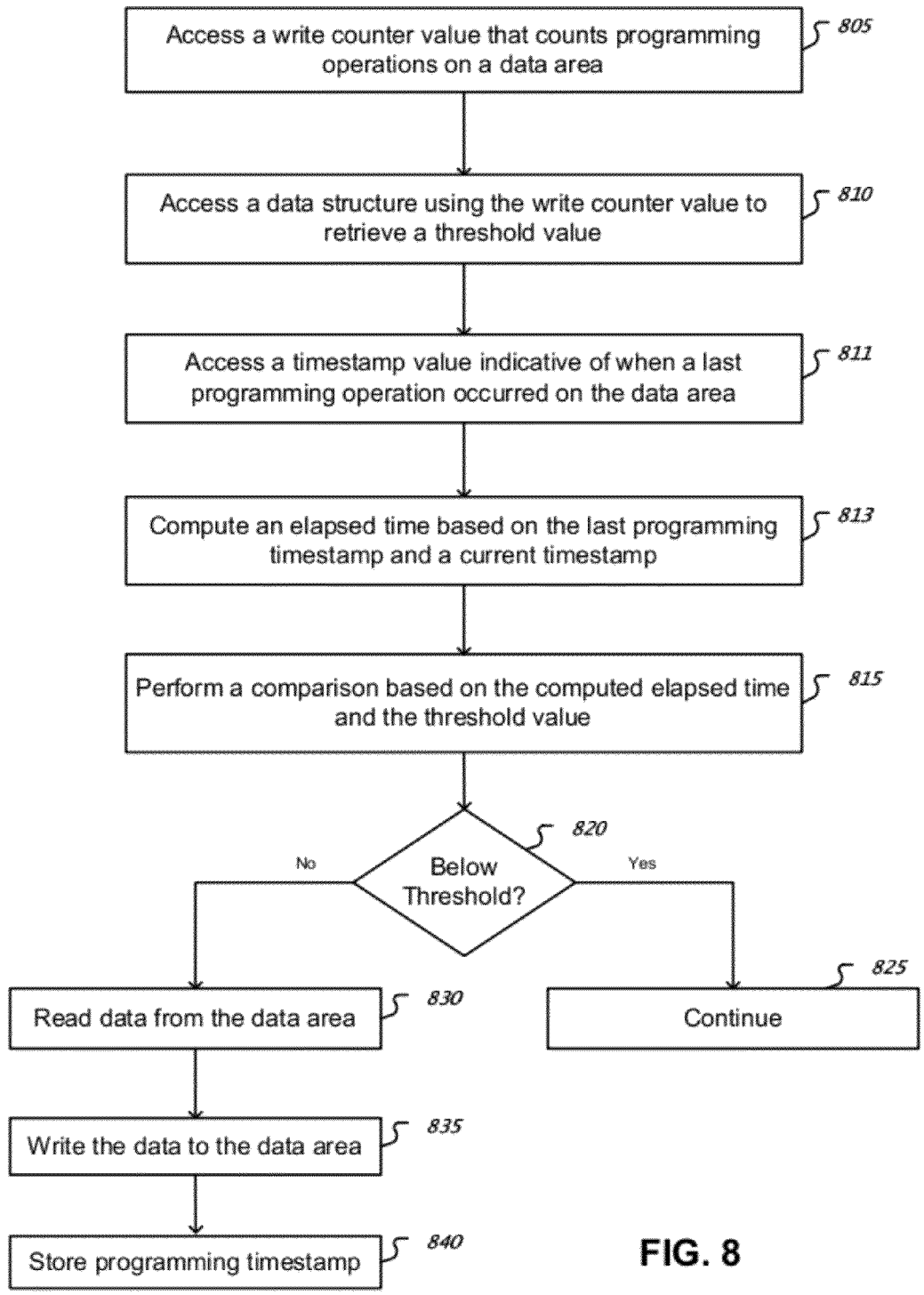
FIG. 8 shows a example of a timestamp based technique for selective reprogramming.

FIG. 8 shows a example of a timestamp based technique for selective reprogramming. A processing device can access 805 a write counter value that counts programming operations on a data area. The device can access 810 a data structure, such as a threshold data structure, using the write counter value to retrieve a threshold value such as maximum elapsed time value. The threshold data structure can include multiple threshold values that correspond to multiple respective ranges for write counter values.

The device can access 811 a timestamp value indicative of when a last programming operation occurred on the data area and can compute 813 an elapsed time based on the last programming timestamp and a current timestamp. The device can perform 815 a comparison based on the computed elapsed time and the threshold value.

If the computed elapsed time is below the threshold value 820, the device can continue 825 other operations. In some implementations, a read operation can trigger the technique of FIG. 8. Therefore, continuing other operations can include continuing on to read data from the data area.

If the threshold value is equal to or above the threshold value 820, the device can perform a reprogramming operation. In an example of a reprogramming operation, the device can read 830 data from the data area, write 835 the data to the same data area, and store 840 the programming timestamp for a future elapsed time computation. In a different example, the device can write 835 the data to a data area different from the data area that was read 830. Some implementations can increment the write counter value associated with the data area in response to the reprogramming operation.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A device comprising:
   a non-volatile memory structure comprising a first data area; and
   a second data area that stores information, the information comprising a first value corresponding to the first data area, the first value being set responsive to a last programming cycle on the first data area, and a second value indicating a total number of programming or erasing operations on the first data area.

2. The device of claim 1, wherein the information further comprises a threshold data structure that contains threshold values, each of the threshold values mapping a total number of programming operations on a data area to an allowable number of read operations.

3. The device of claim 1, wherein the first value is indicative of a timestamp corresponding to the last programming cycle on the first data area.

4. The device of claim 1, wherein the first value comprises a counter value, the counter value indicating a count of read operations on the first data area since the last programming cycle on the first data area.

5. The device of claim 1, wherein the non-volatile memory structure comprises the second data area.

6. The device of claim 1, wherein the second value indicates the total number of programming and erasing operations on the first data area.

7. A system comprising:
   a non-volatile memory structure comprising a first data area;
   a second data area that stores information, the information comprising a first value corresponding to the first data area, the first value being set responsive to a last programming cycle on the first data area, and a second value indicating a total number of programming or erasing operations on the first data area; and
   circuitry configured to selectively reprogram data of the first data area based on the first value and the second value.

8. The system of claim 7, wherein the information further comprises a threshold data structure that contains threshold values, each of the threshold values mapping a total number of programming operations on a data area to an allowable number of read operations.

9. The system of claim 8, wherein the circuitry is configured to retrieve a threshold value from the threshold data structure based on the second value, perform a comparison using the retrieved threshold value and the first value, and reprogram the data of the first data area based on the comparison.

10. The system of claim 7, wherein the first value is indicative of a timestamp corresponding to the last programming cycle on the first data area.

11. The system of claim 7, wherein the first value comprises a counter value, the counter value indicating a count of read operations on the first data area since the last programming cycle on the first data area.

12. The system of claim 7, wherein the non-volatile memory structure comprises the second data area.

13. The system of claim 7, wherein the second value indicates the total number of programming and erasing operations on the first data area.

14. An apparatus comprising:
   a non-volatile memory structure comprising data areas;
   write counters corresponding to the data areas, the write counters indicating a number of programming or erasing operations on corresponding ones of the data areas; and
   read counters corresponding to the data areas, the read counters indicating a number of read operations on corresponding ones of the data areas, each read counter being set to zero in response to a programming or erasing operation on a corresponding one of the data areas.

15. The apparatus of claim 14, wherein the write counters are stored in a dedicated region of the non-volatile memory structure.

16. The apparatus of claim 14, wherein the read counters are stored in a dedicated region of the non-volatile memory structure.

17. The apparatus of claim 14, wherein the write counters are adjacent to their respective data areas.

18. The apparatus of claim 14, wherein the read counters are adjacent to their respective data areas.

19. The apparatus of claim 14, further comprising:
   an additional non-volatile memory structure that comprises the write counters and the read counters.

* * * * *